(12) United States Patent
Nagasaka

(10) Patent No.: US 9,318,750 B2
(45) Date of Patent: Apr. 19, 2016

(54) GAS CELL MANUFACTURING APPARATUS

(71) Applicant: Seiko Epson Corporation, Tokyo (JP)

(72) Inventor: Kimio Nagasaka, Hokuto (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/581,262

(22) Filed: Dec. 23, 2014

(65) Prior Publication Data
US 2015/0107097 A1   Apr. 23, 2015

Related U.S. Application Data

(62) Division of application No. 13/417,647, filed on Mar. 12, 2012, now Pat. No. 8,964,293.

(30) Foreign Application Priority Data

Mar. 23, 2011   (JP) .................. 2011-064217

(51) Int. Cl.
*G02B 5/30* (2006.01)
*H01M 6/00* (2006.01)
*H01M 2/36* (2006.01)
*G01R 33/032* (2006.01)

(52) U.S. Cl.
CPC .............. *H01M 6/005* (2013.01); *G01R 33/032* (2013.01); *H01M 2/365* (2013.01); *Y10T 29/4998* (2015.01); *Y10T 29/53139* (2015.01)

(58) Field of Classification Search
CPC .... H01M 6/005; H01M 2/365; G01R 33/032; Y10T 29/4998
USPC .............. 250/428, 432 R; 324/300, 301, 304, 324/305; 356/246; 359/484.1
See application file for complete search history.

(56) References Cited

U.S. PATENT DOCUMENTS

| | | | | |
|---|---|---|---|---|
| 5,517,157 A | * | 5/1996 | English | H03L 7/26 331/3 |
| 5,642,625 A | * | 7/1997 | Cates, Jr. | A61K 49/1815 62/55.5 |
| 6,942,467 B2 | | 9/2005 | Deninger et al. | |
| 7,872,473 B2 | | 1/2011 | Kitching et al. | |
| 7,931,794 B2 | * | 4/2011 | Happer | G04F 5/14 205/406 |
| 8,415,612 B2 | * | 4/2013 | McBride | G21K 1/00 250/251 |
| 8,587,304 B2 | | 11/2013 | Budker et al. | |
| 2003/0183520 A1 | * | 10/2003 | Mabuchi | G01N 27/419 204/424 |
| 2005/0084450 A1 | * | 4/2005 | Hattori | G01R 33/282 424/9.3 |
| 2006/0132130 A1 | * | 6/2006 | Abbink | G01C 19/60 324/304 |

(Continued)

FOREIGN PATENT DOCUMENTS

| | | |
|---|---|---|
| CN | 101587808 A | 11/2009 |
| EP | 1930113 A1 | 6/2008 |

(Continued)

*Primary Examiner* — Frank Font
(74) *Attorney, Agent, or Firm* — Harness, Dickey & Pierce, P.L.C.

(57) ABSTRACT

A manufacturer of gas cells performs an arrangement process of arranging solid substances at positions corresponding to holes each of which is provided on each of a plurality of cells. Then, the manufacturer of the gas cells performs an accommodation process of accommodating gas in inner spaces of the cells through an air flow path connected to the holes. Further, the manufacturer of the gas cells performs a sealing process of sealing the spaces by melting the solid substances to close the holes corresponding to the solid substances.

4 Claims, 9 Drawing Sheets

(56) References Cited

U.S. PATENT DOCUMENTS

| | | |
|---|---|---|
| 2008/0138548 A1 | 6/2008 | Sciara |
| 2009/0169147 A1 | 7/2009 | Ellwood, Jr. |
| 2009/0174489 A1* | 7/2009 | Aoyama ............ H03L 7/26 331/94.1 |
| 2009/0288363 A1 | 11/2009 | Liu et al. |
| 2010/0289491 A1 | 11/2010 | Budker et al. |
| 2010/0301853 A1* | 12/2010 | Happer ............ G01R 33/282 324/304 |

FOREIGN PATENT DOCUMENTS

| | | |
|---|---|---|
| JP | 50-003291 A | 1/1975 |
| JP | 50-098770 A | 8/1975 |
| JP | 10-064414 | 3/1998 |
| JP | 3523502 B2 | 4/2004 |
| JP | 2007-053808 A | 3/2007 |
| JP | 2009212416 A * | 9/2009 |
| JP | 2009-236599 A | 10/2009 |
| JP | 2010-085134 A | 4/2010 |

* cited by examiner

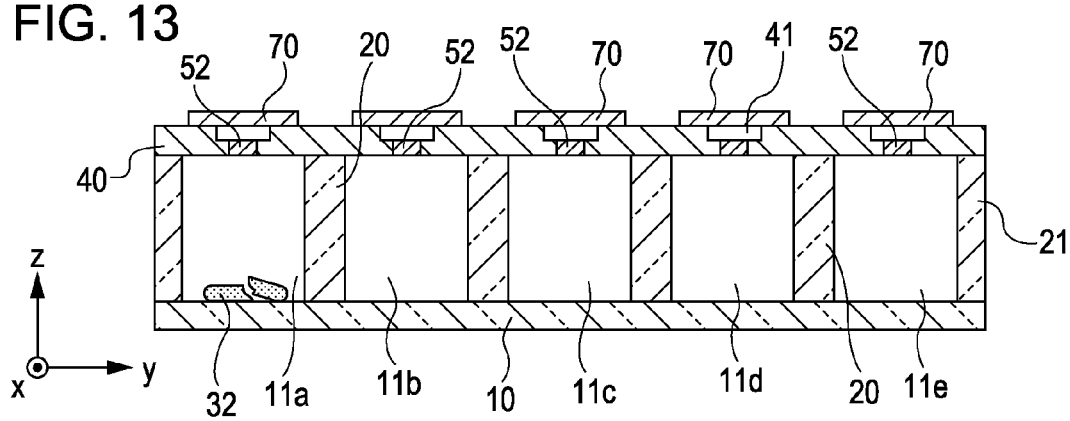
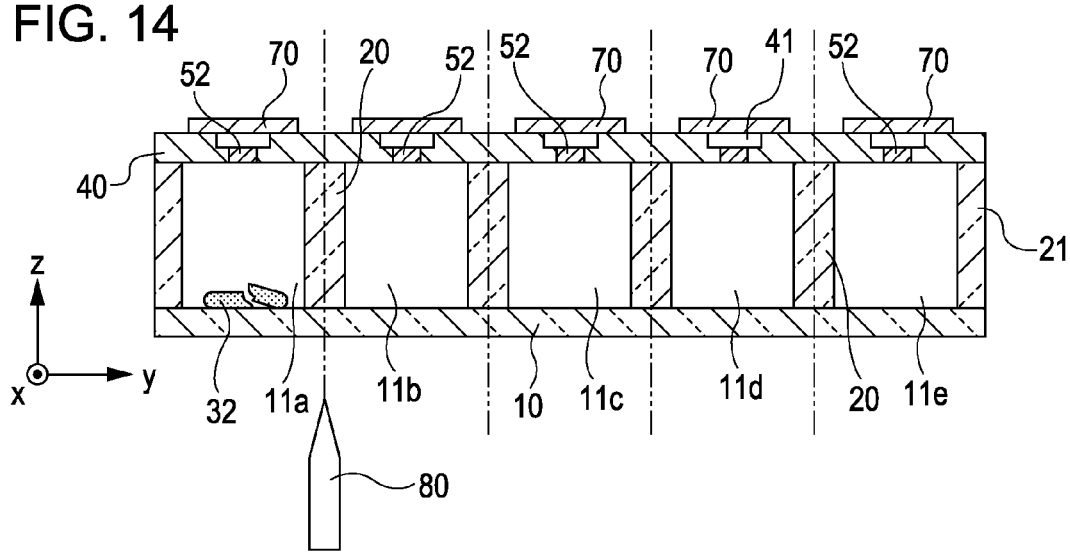
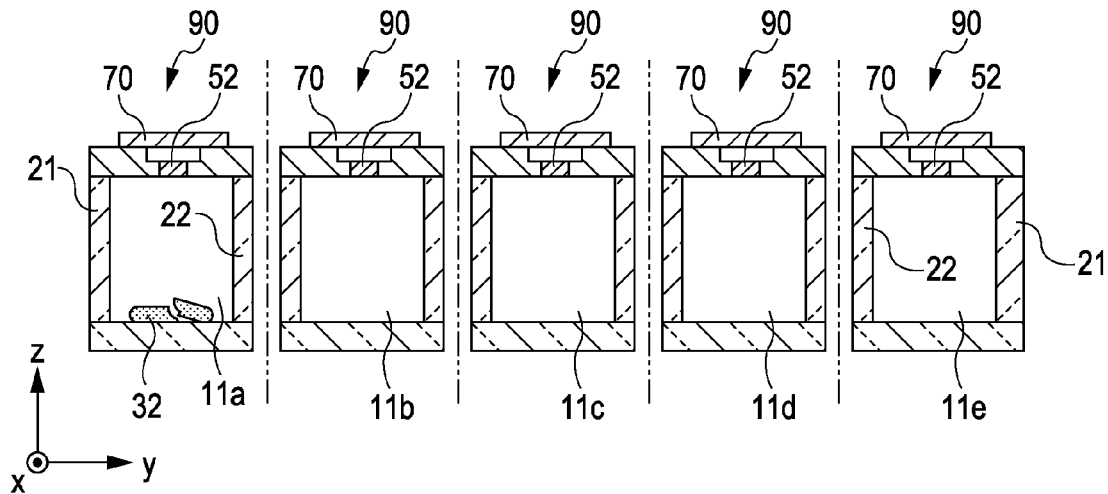

GAS CELL MANUFACTURING APPARATUS

CROSS-REFERENCE TO RELATED APPLICATIONS

This is a divisional patent application of U.S. application Ser. No. 13/417,647 filed Mar. 12, 2012 which claims priority to Japanese Patent Application No. 2011-064217 filed Mar. 23, 2011 all of which are incorporated by reference herein in their entireties.

BACKGROUND

1. Technical Field

The present invention relates to techniques of a gas cell, a gas cell manufacturing apparatus and a gas cell manufacturing method.

2. Related Art

A magnetic sensor using optical pumping is used for a magnetic resonance imaging (MRI) apparatus or the like. The magnetic sensor has a cell which encapsulates alkali metal atoms or the like in a gaseous state. If pump light having a circularly polarized component is irradiated onto the cell, the encapsulated atoms are excited. Further, if probe light having a linearly polarized light component is irradiated onto the cell such that the probe light intersects with the pump light, the excited atoms rotate a polarization plane of the linearly polarized light contained in the probe light in accordance with a magnetic field applied from the outside. The magnetic sensor detects a rotation angle of the polarization plane of the probe light transmitted through the cell so as to measure the magnetic field.

Since the cell is transmissive to light, at least a part of the cell needs to be formed by a transparent member. Further, the cell is required to be sealed for accommodating the excited atoms. As a technique of making an inner portion of a container formed by a transparent member into a sealed state, for example, the following method of manufacturing an image display apparatus has been disclosed in JP-A-10-64414. The method of manufacturing an image display apparatus as disclosed in JP-A-10-64414 is a method including softening a part of a glass-made exhaust pipe attached to an envelope with an electric heating unit (first process), extending the exhaust pipe in a shaft direction of the exhaust pipe so as to make an outer diameter thereof smaller (second process), heating the portion of which outer diameter has been made smaller to a temperature of equal to or higher than that in the first process again so as to melt and seal the portion (third process), cutting the molten portion (fourth process), and gradually cooling the portion with the electric heating unit (fifth process).

SUMMARY

An advantage of some aspects of the invention is to manufacture a plurality of gas cells each of which has a uniform volume and accommodates gas having a uniform concentration in comparison with a case where a glass tube for exhausting gas is used.

A gas cell manufacturing method according to an aspect of the invention includes arranging solid substances at positions corresponding to holes each of which is provided on each of a plurality of cells, accommodating gas in inner spaces of the cells through an air flow path connected to the holes, and sealing the spaces by melting the solid substances to close the holes corresponding to the solid substances. With this configuration, a plurality of gas cells each of which has a uniform volume and accommodates gas having a uniform concentration can be manufactured in comparison with a case where a glass tube for exhausting gas is used.

In the gas cell manufacturing method according to the aspect of the invention, it is preferable that the method further include generating temperature gradient on inner walls of the cells such that a temperature is lower as is farther from the holes of the cells. With this configuration, a material to be accommodated in the inner spaces of the cells can be reliably prevented from being not accommodated in comparison with a case where the temperature gradient is not generated.

Further, in the gas cell manufacturing method according to the aspect of the invention, it is preferable that the method further include forming the air flow path with a recess by attaching a plate on which the recess is provided to the cells such that the holes are arranged along the recess, and removing the plate having the recess which forms the air flow path from the cells after the sealing. With this, configurations of finished gas cells can be made simple in comparison with a case where this configuration is not provided.

Further, in the gas cell manufacturing method according to the aspect of the invention, it is preferable that the method further include reinforcing the sealing of the spaces by bonding plate-form members to the cells so as to cover the holes closed by the solid substances after the removing. With this configuration, the air flow path is removed so that sealing of the solid substances exposed to the outside can be reinforced.

Further, in the gas cell manufacturing method according to the aspect of the invention, it is preferable that the method further include separating the cells from one another by cutting separation walls which partition inner spaces of the cells. With this configuration, a plurality of gas cells which are individually arranged for use can be manufactured.

Further, in the gas cell manufacturing method according to the aspect of the invention, it is preferable that the method further include assembling the plurality of cells by bonding a first plate, a second plate which is arranged so as to be opposed to the first plate and on which holes penetrating through the second plate in the thickness direction are provided, and the separation walls which are arranged between the first plate and the second plate to one another. With this configuration, the gas cells can be manufactured by bonding the plates.

Further, in the gas cell manufacturing method according to the aspect of the invention, it is preferable that the assembling include installing a generation source which generates the gas in at least one cell among the cells, and the accommodating include making the installed generation source generate the gas. With this configuration, gas can be generated in the spaces after the spaces in the plurality of cells are connected to only the air flow path and are shielded from an external space.

Further, in the gas cell manufacturing method according to the aspect of the invention, it is preferable that two or more holes be provided for at least one cell among the plurality of cells. With this configuration, flow of gas in the spaces is made difficult to be stagnated.

Further, in the gas cell manufacturing method according to the aspect of the invention, it is preferable that the air flow path be reduced in diameter or closed such that the gas is difficult to flow through a portion on which the two or more holes provided for the one cell are connected to one another in comparison with other portions. With this configuration, gas to be flowed in the spaces can be suppressed from flowing in the air flow path.

Further, in the gas cell manufacturing method according to the aspect of the invention, it is preferable that the gas contain atoms which rotate a polarization plane of linearly polarized light in accordance with a magnetic field if the atoms are excited with light. With this configuration, a plurality of gas cells which are used for measuring a magnetic field and each of which has a uniform volume and accommodates gas having a uniform concentration can be manufactured in comparison with a case where a glass tube for exhausting gas is used.

A gas cell manufacturing apparatus according to another aspect of the invention includes an arrangement unit which arranges solid substances at positions corresponding to holes each of which is provided on each of a plurality of cells, an accommodation unit which accommodates gas in inner spaces of the cells through an air flow path connected to the holes, and a sealing unit which seals the spaces by melting the solid substances to close the holes corresponding to the solid substances. With this configuration, a plurality of gas cells each of which has a uniform volume and accommodates gas having a uniform concentration can be manufactured in comparison with a case where a glass tube for exhausting gas is used.

A gas cell according to still another aspect of the invention includes a wall for separating a space which accommodates gas containing atoms which rotate a polarization plane of linearly polarized light in accordance with a magnetic field if the atoms are excited with light from an outer space. In the gas cell, a hole provided on the wall is closed by a molten solid substance.

Further, in the gas cell according to the aspect of the invention, it is preferable that a plate-like member be bonded to the wall so as to cover the hole from the outside.

BRIEF DESCRIPTION OF THE DRAWINGS

The invention will be described with reference to the accompanying drawings, wherein like numbers reference like elements.

FIG. 13 is a view illustrating a state of the gas cells in a reinforcing process.

FIG. 14 is a view illustrating a state of the gas cells in a separation process.

FIG. 15 is a view illustrating a state of the gas cells when the separation process has been completed.

DESCRIPTION OF EXEMPLARY EMBODIMENTS

1. Embodiment

Figure 1:
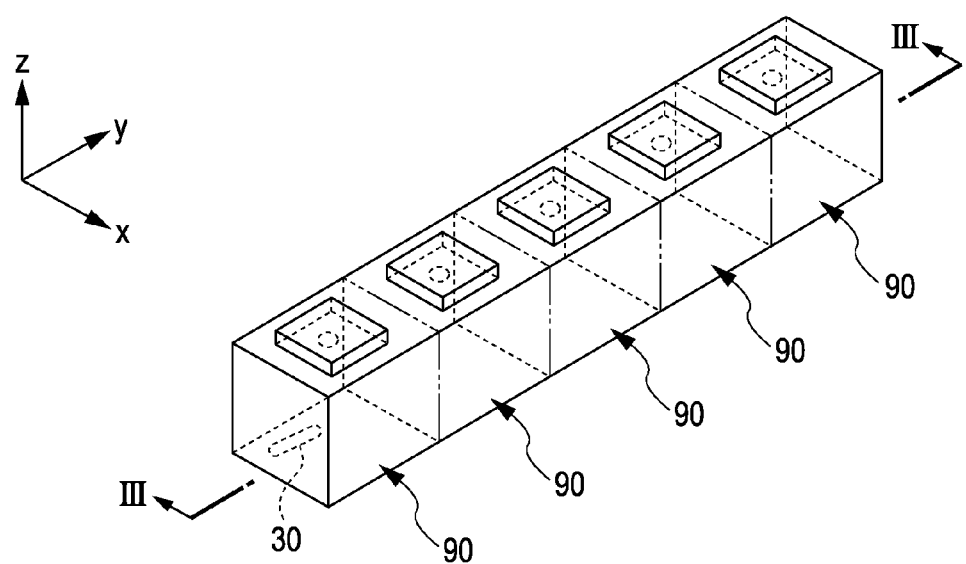
FIG. 1 is a view illustrating an outer appearance of gas cells which are manufactured by a manufacturing method according to an embodiment.

FIG. 1 is a view illustrating an outer appearance of gas cells 90 which are manufactured by a manufacturing method according to an embodiment of the invention. A space in which the gas cells 90 are arranged is illustrated in a right-handed coordinate system for explaining shapes and arrangement of the gas cells 90. Further, a symbol that a white circle having a black circle therein among coordinate symbols as illustrated in the drawings subsequent to FIG. 3 below indicates an arrow pointing to the front side of a paper plane from the rear side thereof. Further, a symbol that a white circle having two segments therein, which are intersected with each other, among the coordinate symbols as illustrated in the drawings indicates an arrow pointing to the rear side of a paper plane from the front side thereof. A direction in which an X component increases in the space is referred to as a +x direction, a direction in which the x component decreases is referred to as a −x direction. As for y and z components, a +y direction, a −y direction, a +z direction, and a −z direction are defined in the same manner as the x component. It is to be noted that in the following embodiment, the −z direction corresponds to the gravity direction.

Figure 2:
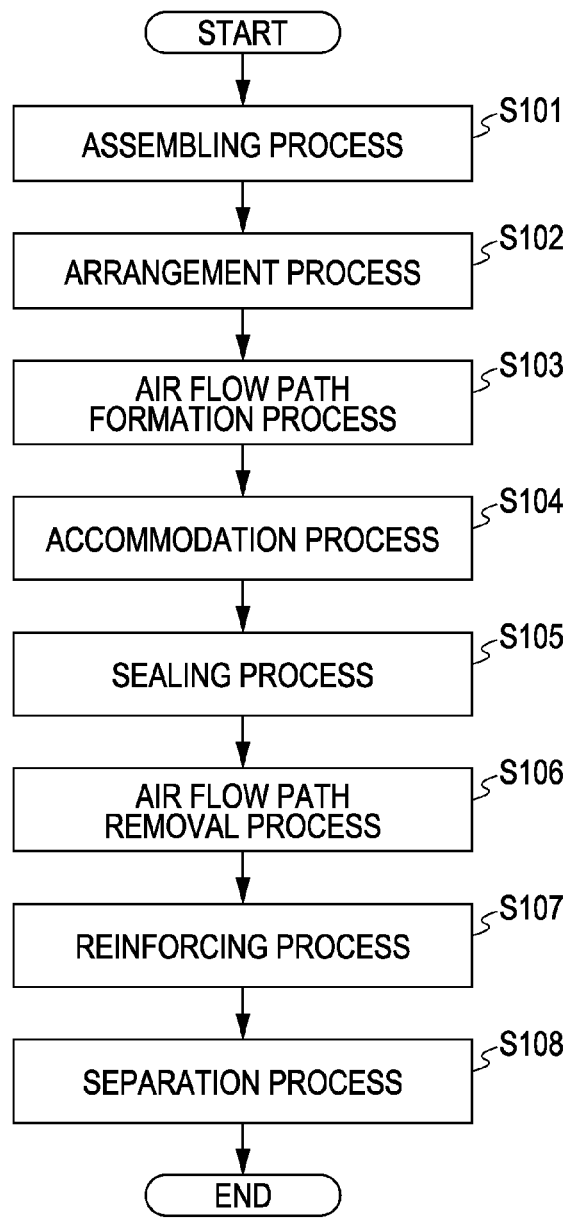
FIG. 2 is a flowchart illustrating main manufacturing processes of the manufacturing method according to the embodiment.

FIG. 2 is a flowchart illustrating main manufacturing processes of the manufacturing method according to the embodiment of the invention. The manufacturing method according to the embodiment of the invention includes an assembling process (step S101), an arrangement process (step S102), an air flow path formation process (step S103), an accommodation process (step S104), a sealing process (step S105), an air flow path removal process (step S106), a reinforcing process (step S107), and a separation process (step S108). The gas cells 90 as illustrated in FIG. 1 are in a state after the reinforcing process has been completed and before the separation process is started. Five gas cells 90 as illustrated in FIG. 1 are arranged in the +y direction. Hereinafter, the processes as illustrated in FIG. 2 are described by using cross-sectional views seen from a line III-III as illustrated in FIG. 1.

1-1. Assembling Process

Figure 3:
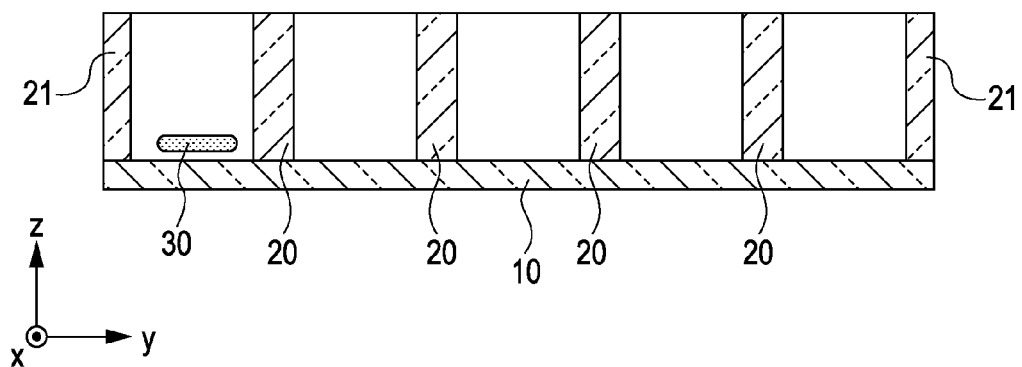
FIG. 3 is a view illustrating a state of the gas cells in a middle of an assembling process.

FIG. 3 is a view illustrating a state of the gas cells in a middle of the assembling process. In the assembling process in the manufacturing method according to the embodiment of the invention, two side wall plates 21 and four separation wall plates 20 are bonded to a bottom plate 10 by fusion bonding. The bottom plate 10, the side wall plates 21, and the separation wall plates 20 are plates each of which is formed by a transparent member such as a glass. Further, after the bottom plate 10, the side wall plates 21, and the separation wall plates 20 have been bonded to one another in the above manner, a front plate is bonded to them from the +x direction and a rear plate is bonded to them from the −x direction by fusion bonding (the front plate and the rear plate are not illustrated). Each of the front plate and the rear plate is a plate formed by a transparent member such as a glass. With this, a structure having a quadrangular prism shape, which has five openings, is assembled. The five openings open in the +z direction and are arranged in line in the +y direction. As a bonding method of the members, a bonding method with a glass having a low melting point or a brazing material may be applied instead of the fusion bonding in which parts of the members are molten by heating so as to bond the members to one another as described above. Further, anodic bonding performed by heating and voltage application, optical bonding by using a resin which is cured by irradiating the resin with light such as ultraviolet rays, or the like may be applied. In addition, the members may be bonded to one another by employing optical contact in which bonding surfaces of the members, which have been precisely ground, are made contact with one another while pressurizing the bonding surfaces of the members as the bonding method of the members.

In the assembling state as illustrated in FIG. 3, an ampule 30 is put into a space 11 through one of the openings (opening at the most −y direction side) so as to be installed in the space 11. The ampule 30 is formed by a material that is broken if any energy such as a mechanical, thermal, or optical impact is applied to an outer frame thereof. As the optical impact, short-pulse laser is irradiated onto the outer frame, for example. Two or more materials are stored in the ampule 30 so as to be separated from one another. The two or more materials generate alkali metal vapor if the materials are mixed to each other. For example, a chloride and a reducing agent are used for these materials. That is to say, the process of installing the ampule 30 in the space 11 is an example of an installation process of installing a generation source which generates the gas in at least one cell among the cells.

It is to be noted that a material that generates alkali metal vapor by applying Joule heat to only the material or heating it with laser irradiation, such as alkali metal azide, may be encapsulated in the ampule 30. In this case, the two or more materials are not required to be stored in the ampule 30 and a material of single type may be stored therein.

Figure 4:
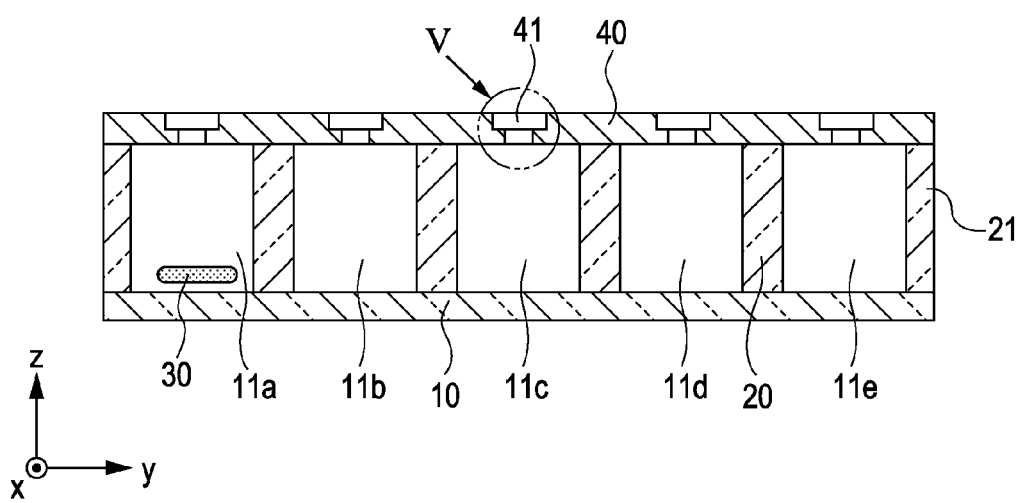
FIG. 4 is a view illustrating a state of the gas cells when the assembling process has been completed.

FIG. 4 is a view illustrating a state of the gas cells when the assembling process has been completed. In FIG. 3, the bottom plate 10, the side wall plates 21, the separation wall plates 20, the front plate, and the rear plate which have been assembled, have five openings which open in the +z direction. A ceiling plate 40 is attached to them so as to cover the openings. The ceiling plate 40 (second plate) is arranged so as to be opposed to the bottom plate 10 (first plate) and is fusion-bonded to the front plate, the rear plate, the side wall plates 21 and the separation wall plates 20. If these members are bonded to and combined with one another, an inner portion of the structure is partitioned into five spaces 11a, 11b, 11c, 11d, and 11e (hereinafter, these spaces are collectively referred to as "spaces 11" when they need not be particularly distinguished from one another), as illustrated in FIG. 4.

Figure 5:
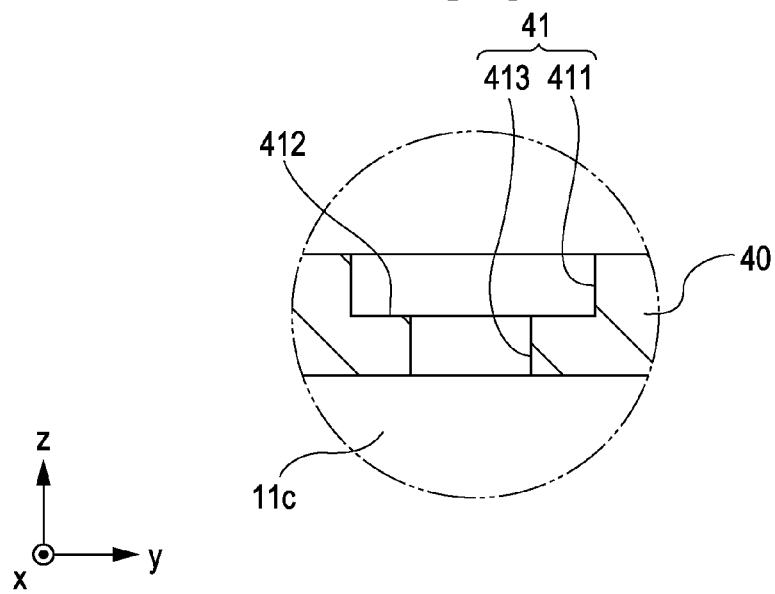
FIG. 5 is a schematic view illustrating a hole provided on a ceiling plate in an enlarged manner.

Holes 41 are provided on the ceiling plate 40 at positions each of which corresponds to each space 11. FIG. 5 is a schematic view illustrating the hole 41 (V portion in FIG. 4) provided on the ceiling plate in an enlarged manner. Each hole 41 includes a large-diameter portion 411 and a small-diameter portion 413. The large-diameter portion 411 is provided on the ceiling plate 40 at the +z direction side. The small-diameter portion 413 is provided on the ceiling plate 40 at the −z direction side so as to be concentric to the large-diameter portion 411. The diameter of the large-diameter portion 411 is larger than the diameter of the small-diameter portion 413. A step 412 is formed due to the difference in size thereof. That is to say, the ceiling plate 40 is arranged so as to be opposed to the first plate and is an example of the second plate on which holes penetrating therethrough in the thickness direction are provided. The assembling process is an example of an assembling process for assembling the plurality of cells by bonding a first plate, a second plate which is arranged so as to be opposed to the first plate and on which holes penetrating through the second plate in the thickness direction are provided, and the separation walls which are arranged between the first plate and the second plate to one another.

Both of the large-diameter portion 411 and the small-diameter portion 413 have substantially circular shapes when seen in the +z direction. However, the shapes thereof are not limited thereto and may be oval shapes, rectangular shapes, and other various polygonal shapes. It is to be noted that the holes 41 may be plated by tungsten (W), nickel (Ni), gold (Au), or the like.

1-2. Arrangement Process

Figure 6:
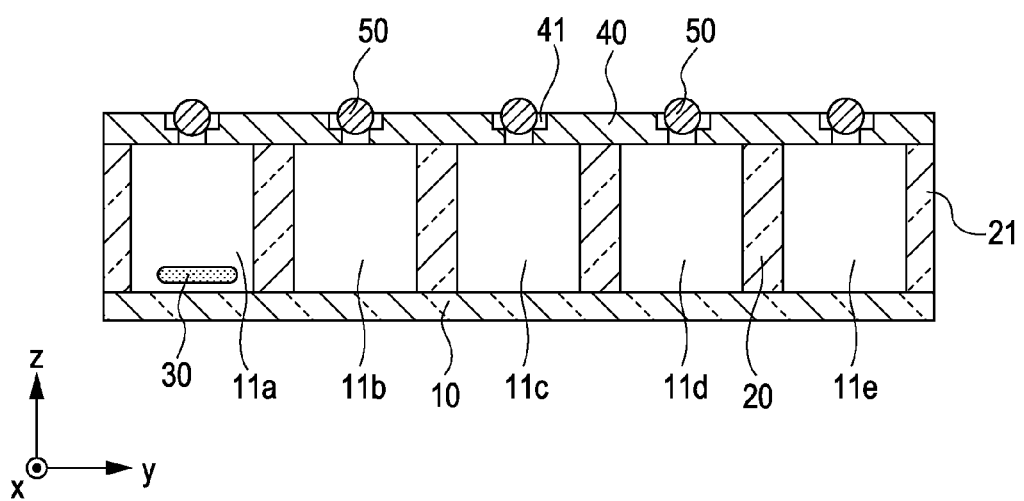
FIG. 6 is a view illustrating a state of the gas cells in an arrangement process.

FIG. 6 is a view illustrating a state of the gas cells in the arrangement process. Solid substances 50 are arranged at positions each of which corresponds to each hole 41 provided on the ceiling plate 40 for each space 11. Each solid substance 50 is formed by a gold-based alloy solder including Au—Sn or Au—Ge and a shape thereof is a spherical shape. Since a diameter of each solid substance 50 is longer than the diameter of each small-diameter portion 413, a part thereof is placed on each step 412 such that the solid substance 50 does not drop into each space 11. Further, the solid substances 50 have shapes which do not completely close the small-diameter portions 413 in a state of being placed on the steps 412. Therefore, the spaces 11 and a space at the +z direction side of the ceiling plate 40 are communicated with one another through the holes 41. That is to say, the large-diameter portions 411 have a function of positioning the solid substances 50 at positions corresponding to the holes 41 on an xy plane of FIG. 6. The steps 412 have a function of preventing the solid substances 50 from dropping into the spaces 11. Therefore, the solid substances 50 do not inhibit air from flowing through the holes 41. It is to be noted that the shape of each solid substance 50 is not limited to the spherical shape and may be a rectangular parallelepiped, a regular hexahedron, a regular tetrahedron, or the like. In other words, it is sufficient that the solid substances 50 have shapes that do not close the small-diameter portions 413. Further, the material of each solid substance 50 is not limited to the gold-based alloy solder and may be a glass having a low melting point, for example. In this case, the above-described plating on the holes 41 may be not necessary.

1-3. Air Flow Path Formation Process

Figure 7:
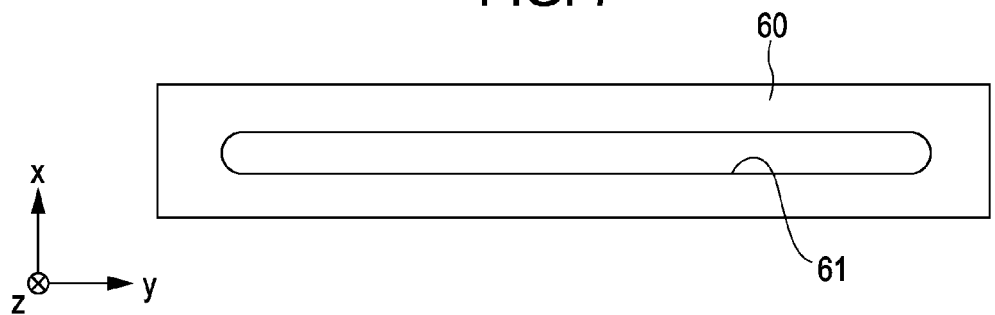
FIG. 7 is a view illustrating an air flow path plate.
Figure 8:
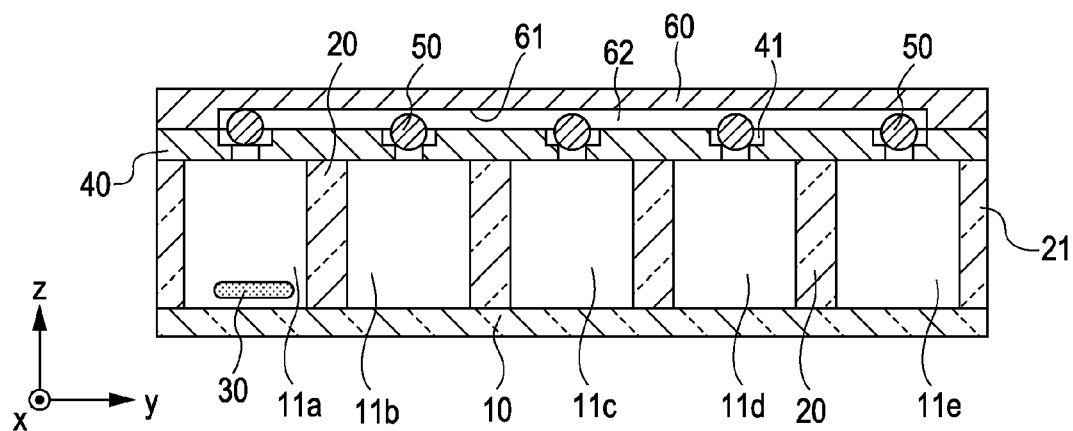
FIG. 8 is a view illustrating a state of the gas cells in an air flow path formation process.

FIG. 7 is a view illustrating an air flow path plate 60 when seen toward the +z direction. As illustrated in FIG. 7, a groove 61 extending in the +y direction is provided on a surface of the air flow path plate 60 at the −z direction side. The groove 61 is an example of a recess and is recessed in comparison with a surface of the air flow path plate 60 at the −z direction side. FIG. 8 is a view illustrating a state of the gas cells in the air flow path formation process. As illustrated in FIG. 8, the air flow path plate 60 is attached to the ceiling plate 40 from the +z direction side of the ceiling plate 40 by fusion bonding or the like. With this, an air flow path 62 connecting the holes 41 is formed with the surface of the ceiling plate 40 at the +z direction side and the groove 61 of the air flow path plate 60. The five spaces 11 communicate with one another through the air flow path 62 and the holes 41 connected to the air flow path 62. That is to say, the air flow path formation process is an example of a formation process of forming the air flow path with a recess by attaching a plate on which the recess is provided to the cells such that the cells are arranged along the recess.

If the air flow path formation process has been completed, although the five spaces 11 communicate with one another through the air flow path 62, the five spaces 11 are shielded from external spaces at the +z direction side of the air flow path plate 60 and at the −z direction side of the bottom plate 10. Accordingly, in order to make a time during which spin polarized states of the alkali metal atoms are kept longer, inert gas such as helium (He), Argon (Ar), Neon (Ne), and Nitrogen ($N_2$) may be encapsulated into each space 11 before the five spaces 11 are shielded from the external spaces. Alternatively, paraffin, a silane-based material or the like may be coated on inner walls of the accommodation spaces before the five spaces 11 are shielded from external spaces. Further, the above-described recess is not limited to a recess extending in one direction like the groove 61. For example, when the spaces 11 arranged in the +y direction are further arranged in the +x direction in a matrix form and an air flow path plate is attached thereto, the recess may be a recess drilled broadly and thinly instead of the groove having the lengthwise direction. In other words, it is sufficient that the recess makes it possible to form the air flow path by attaching a plate having the recess to the cells such that the holes are arranged along the recess. Further, the recess may be provided not on the air flow path plate 60 but on the ceiling plate 40. In this case, it is sufficient that the recess is provided on the ceiling plate 40 at the +z direction side and is attached to a flat surface of the air flow path plate 60 so as to form an air flow path. An air flow path formed in a pipe form may be directly joined to the holes 41 instead of attaching a plate-form member like the air flow path plate 60 to the ceiling plate 40.

1-4. Accommodation Process

Figure 9:
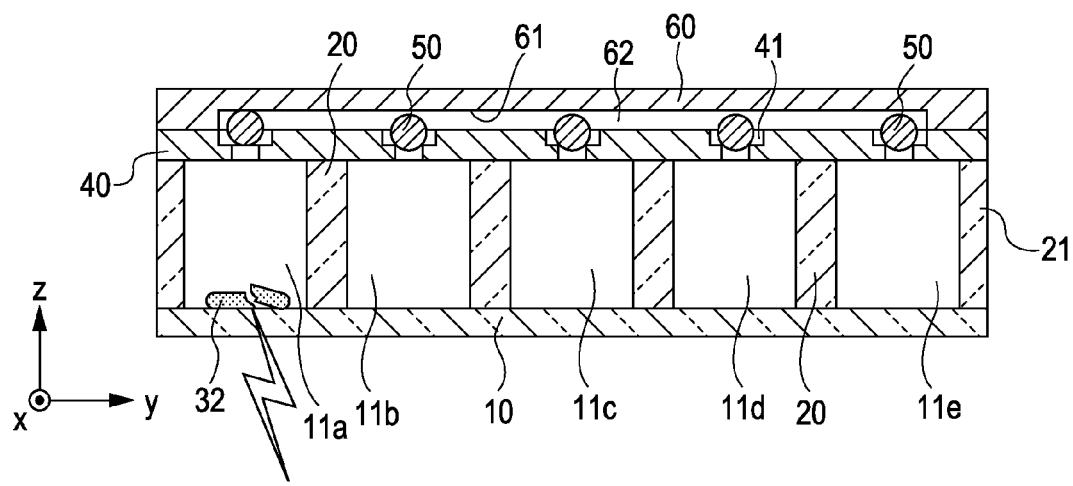
FIG. 9 is a view illustrating a state of the gas cells in an accommodation process.

FIG. 9 is a view illustrating a state of the gas cell in the accommodation process. A manufacturer of the gas cells applies a short-pulse laser beam 31 to the ampule 30 as the above-described energy so as to break an outer skin of the ampule 30. If the outer skin is broken, the ampule 30 becomes a used broken ampule 32 and is left in the space 11a. Then, the materials stored in the ampule 30 are mixed with each other so that chemical reaction occurs. With the chemical reaction, gaseous alkali metal atoms (alkali metal vapor) are generated and the space 11a is filled with the alkali metal vapor. That is to say, the process of breaking the outer skin of the ampule 30 so as to generate the alkali metal vapor is an example of a generation process of making the installed generation source generate gas by applying energy from the outside of the cell. The alkali metal vapor flows into the air flow path 62 through the hole 41 and is diffused to other spaces 11b, 11c, 11d, 11e through other holes 41. With this, the alkali metal vapor is accommodated in each space 11.

1-5. Sealing Process

Figure 10:
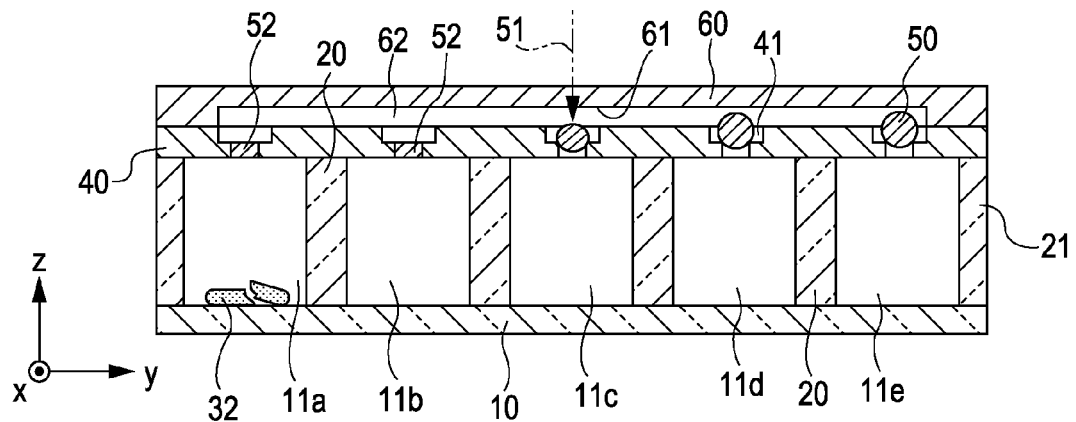
FIG. 10 is a view illustrating a state of the gas cells in a sealing process.
Figure 11:
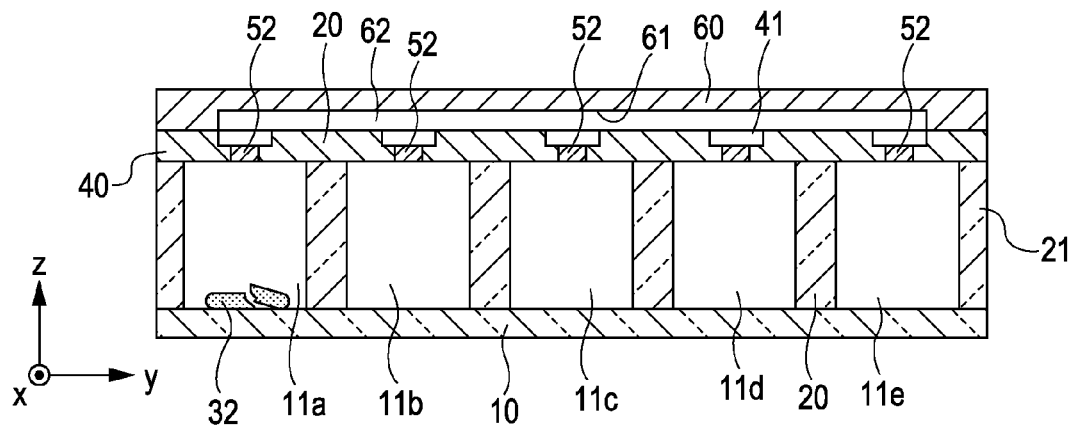
FIG. 11 is a view illustrating a state of the gas cells when the sealing process has been completed.

FIG. 10 is a view illustrating a state of the gas cells in the sealing process. After the alkali metal vapor is accommodated in each space 11 as a result of the above accommodation process, the manufacturer of the gas cells irradiates a laser beam 51 onto the solid substances 50 arranged on the holes 41 from the +z direction side. With this, the solid substances 50 are molten and deformed so as to change to sealing members 52 which close the small-diameter portions 413 of the holes 41. The solid substances 50 are molten by heating with the laser irradiation so as to be a molten state. If the molten metal drops in the small-diameter portions 413, the molten metal is rapidly cooled from the surrounding while the shape thereof being kept with surface tension of itself. With this, the molten metal is solidified while keeping the shape thereof. The solidified materials correspond to sealing members 52. That is to say, the sealing members 52 close the small-diameter portions 413. With the sealing members 52, the spaces 11 and the air flow path 62 are shielded from one another so that the spaces 11 are sealed. FIG. 11 is a view illustrating a state of the gas cells when the sealing process has been completed. If the laser beam 51 is irradiated onto each of the solid substances 50, all of the five spaces 11 are sealed by the sealing members 52 as illustrated in FIG. 11.

It is to be noted that although the laser beam 51 is irradiated from the +z direction side to the −z direction side, the irradiation direction is not limited to the mode and the laser beam 51 may be irradiated from the −z direction side to the +z direction side through the bottom plate 10.

1-6. Air Flow Path Removal Process

Figure 12:
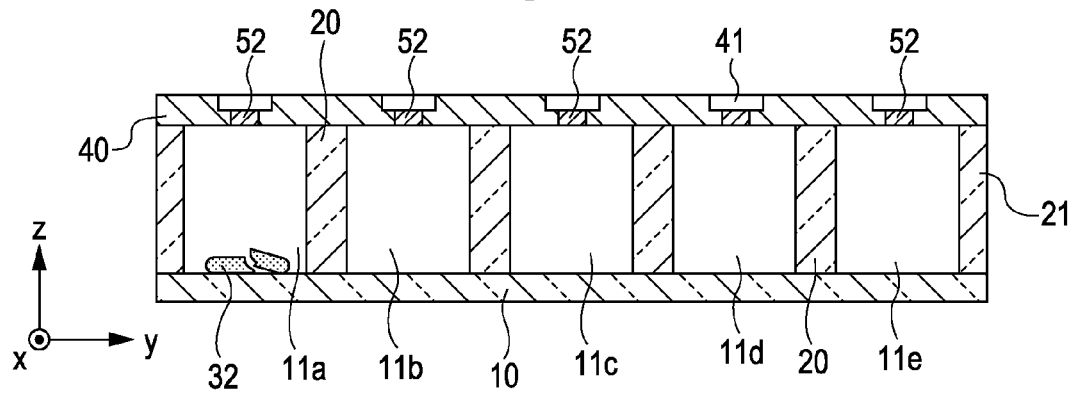
FIG. 12 is a view illustrating a state of the gas cells when an air flow path removal process has been completed.

After the spaces 11 have been sealed with the sealing members 52, the manufacturer of the gas cells performs an air flow path removal process of removing the air flow path plate 60 from the ceiling plate 40 by grinding or cutting the air flow path plate 60 with a cutting machine or the like. FIG. 12 is a view illustrating a state of the gas cells when the air flow path removal process has been completed. As illustrated in FIG. 12, since the air flow path plate 60 has been removed, there is no air flow path 62 so that the sealing members 52 are exposed to the outside. That is to say, the air flow path removal process is an example of a removal process of removing a plate having the recess which forms the air flow path from the cells after the sealing process.

1-7. Reinforcing Process

FIG. 13 is a view illustrating a state of the gas cells in the reinforcing process. The sealing members 52 include a material having property of corroding the alkali metal vapor. Therefore, sealing with the sealing members 52 for a long period of time may be defective in some case. The reinforcing process is a process of reinforcing the sealing of the spaces 11 with the sealing members 52. In the reinforcing process, sealing plates 70 are bonded to the area covering around the holes 41 so as to cover the sealing members 52 exposed to the outside. Each sealing plate 70 may be a transparent member such as a glass or may be a resin. In other words, it is sufficient that the sealing plates 70 are members which are bonded to the ceiling plate 40 by fusion bonding or the like and can make the alkali metal vapor difficult to be flown to the outside in comparison with the state where the sealing members 52 are exposed. That is to say, the reinforcing process is an example of a reinforcing process of reinforcing the sealing of the spaces by bonding plate-form members to the cells so as to cover the holes closed by the solid substances after the removal process.

1-8. Separation Process

FIG. 14 is a view illustrating a state of the gas cells in the separation process. The separation process is a process of separating a structure formed in the processes by the reinforcing process into a plurality of gas cells 90 each having the space 11 by cutting the separation wall plates 20 which partition the spaces 11. The manufacturer of the gas cells cuts the separation wall plates 20 at four portions as indicated by dashed-two dotted lines in FIG. 14 with a cutting tool 80 such as a dicer, a cutter, or a wire-saw. FIG. 15 is a view illustrating a state of gas cells after the separation process has been completed. Each separation wall plate 20 is cut in a direction of separating two adjacent spaces 11 from each other with the cutting tool 80 so that two wall plates 22 are obtained. With this, the five gas cells 90 having the spaces 11a, 11b, 11c, 11d, 11e, respectively, are separated from one another and completed. That is to say, the separation process is an example of a separation process of separating the cells from one another by cutting separation walls which partition inner spaces of the cells. Each gas cell 90 manufactured by the above processes is an example of a gas cell including a wall for separating a space which accommodates gas containing atoms which rotate a polarization plane of linearly polarized light in accordance with a magnetic field if the atoms are excited with light from an outer space. In the gas cell, a hole provided on the wall is closed by a molten solid substance. Further, the gas cell 90 is an example of a gas cell to which a plate-like member (sealing plate 70) is bonded to the wall so as to cover the hole closed by the solid substance from the outside.

As described above, with the manufacturing method according to the invention, spaces which accommodate gas are sealed by melting solid substances without using an exhaust pipe. Therefore, with the manufacturing method according to the invention, the spaces can be relatively reduced in size in comparison with a sealing container manufacturing method of sealing a container by welding an exhaust pipe to the container, heating the exhaust pipe and extending it in a shaft direction to make an outer diameter thereof smaller, and heating the portion of which outer diameter has been made smaller so as to melt the portion. Further, gas is accommodated in the spaces in a state where the spaces which accommodate the gas are connected to one another with the air flow path. Therefore, concentrations of the gases accommodated in the cells can be suppressed from being varied.

Further, a welding process and a melting and cutting process for an exhaust pipe are not required to be performed. Therefore, cost and time taken for manufacturing can be suppressed. In addition, since melting and cutting by using a burner are not necessary, there is no possibility that combustion gas generated from the burner mixes into the gas cells. Moreover, since the exhaust pipe is not welded to the obtained gas cell, the degree of freedom for arrangement of the obtained gas cell is high. Further, spaces which accommodate the gas can be made smaller because the exhaust pipe forming a dead space is not provided.

2. Variation

The invention is not limited to the above embodiment and may be executed by varying the embodiment as follows. Further, the following variations may be combined.

2-1.

Figure 16:
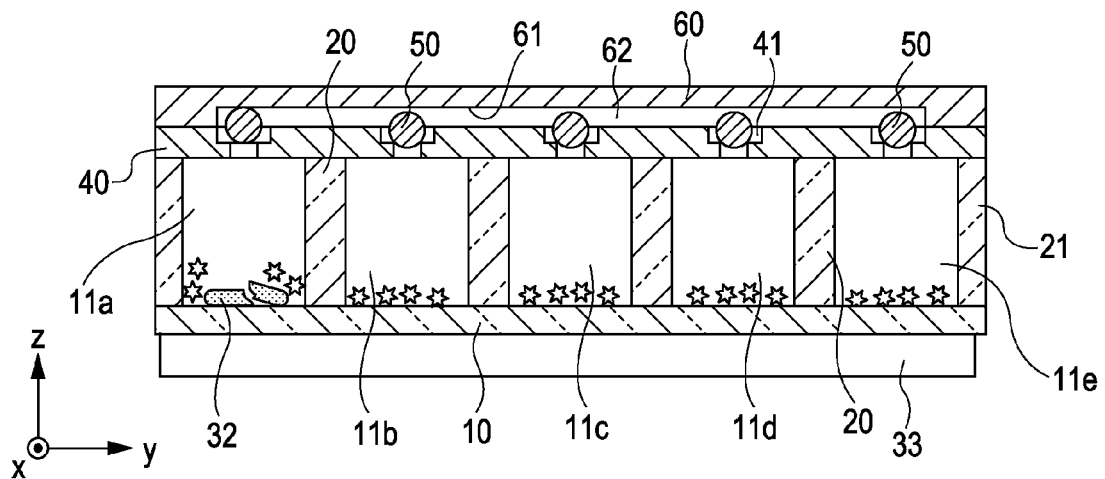
FIG. 16 is a view illustrating a state of the gas cells in a cooling process according to a variation.

In the above embodiment, alkali metal vapor is accommodated in each space 11 in the accommodation process, and each space 11 is sealed with each sealing member 52 in the sealing process subsequent to the accommodation process. However, after the alkali metal vapor is accommodated in the accommodation process, a cooling process of cooling each space 11 so as to condense the alkali metal vapor may be performed before the sealing process. FIG. 16 is a view illustrating a state of gas cells in the cooling process according to the variation. In the variation, a cooling unit 33 such as a peltier element is arranged at the −z direction side of the bottom plate 10 so as to make contact with the bottom plate 10. After the alkali metal vapor is accommodated in each space 11 in the accommodation process, the cooling process of cooling the bottom plate 10 with the cooling unit 33 is performed. With this, the accommodated alkali metal vapor is condensed onto wall surfaces opposed to the spaces 11. That is to say, the cooling process is an example of a cooling process of cooling the cells so as to condense the gas accommodated in the accommodation process onto walls opposed to internal spaces.

Then, after the alkali metal vapor has been condensed, the above-mentioned sealing process is performed. If the alkali metal vapor is condensed in this manner, a concentration of the alkali metal atoms in the gaseous state, which are contained in the spaces 11 and the air flow path 62, is temporarily lowered. Further, if the spaces 11 are sealed in this state, an amount of the alkali metal atoms left in the air flow path 62 which are not used as a magnetic sensor is suppressed. It is to be noted that the cooling unit 33 is not limited to the peltier element and various cooling devices such as a device which circulates a coolant may be used, for example. The portion cooled by the cooling unit 33 is not limited to the bottom plate 10 and it is sufficient that any of wall surfaces opposed to the spaces 11 are cooled.

Further, in addition to or in place of the cooling process by the cooling unit 33, a heating process of heating the cells and an external space of the cells by using a heating unit may be performed. For example, the heating unit may make the alkali metal atoms left in the air flow path 62 easy to move to the above wall surfaces opposed to the spaces 11 by heating the air flow path 62 to a temperature higher than those of any of the wall surfaces opposed to the spaces 11. That is to say, it is sufficient that the cooling unit 33 or the heating unit generates a temperature gradient on inner walls of the cells such that a temperature is lower as is farther from the holes of the cells. That is to say, the process performed by the cooling unit 33 or the heating unit is an example of a temperature gradient generation process of generating a temperature gradient on inner walls of the cells such that a temperature is lower as is farther from the holes of the cells.

2-2.

Figure 17:
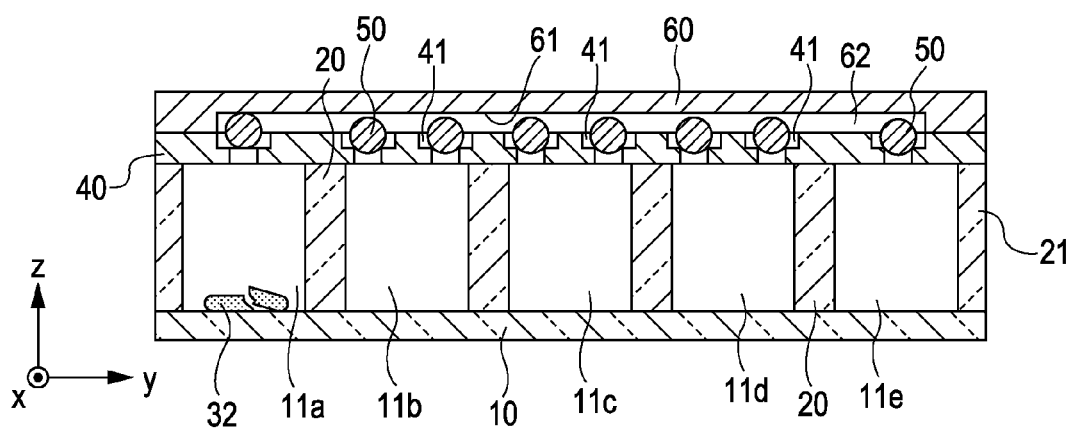
FIG. 17 is a view illustrating a state of the gas cells in an accommodation process according to a variation.

In the above embodiment, one hole 41 is provided on the ceiling plate 40 at a position corresponding to each space 11. However, two or more holes 41 may be provided at positions corresponding to one space 11. FIG. 17 is a view illustrating a state of gas cells in the accommodation process according to the variation. As illustrated in FIG. 17, one hole 41 is provided on the ceiling plate 40 at each of positions corresponding to the space 11*a* and the space 11*e* and two holes 41 are provided thereon at each of positions corresponding to the spaces 11*b*, 11*c*, 11*d*.

If two holes 41 are provided for one space 11, for example, when an atmospheric pressure in a space adjacent to one of the two holes 41 is higher than an atmospheric pressure in a space adjacent to the other of the two holes 41, the one hole 41 serves as an inlet of gas for the space 11 and the other hole 41 serves as an outlet of gas for the space 11. That is to say, if two or more holes 41 are provided for one space 11, any one of the holes 41 serves as an inlet of gas and other holes 41 serve as outlets of gas with a difference of the atmospheric pressure therearound. Therefore, gas is easy to flow through the spaces 11 in comparison with a case where one hole is provided for one space 11. Accordingly, the alkali metal atoms are easy to be accommodated in the spaces 11 in the accommodation process.

It is to be noted that the spaces 11 for which two or more holes are provided are not the space 11*a* at an end in the −y direction and the space 11*e* at an end in the +y direction but the spaces 11*b*, 11*c*, 11*d*. However, the invention is not limited thereto. That is to say, it is sufficient that two or more holes are provided for at least one cell among the plurality of cells.

Figure 18:
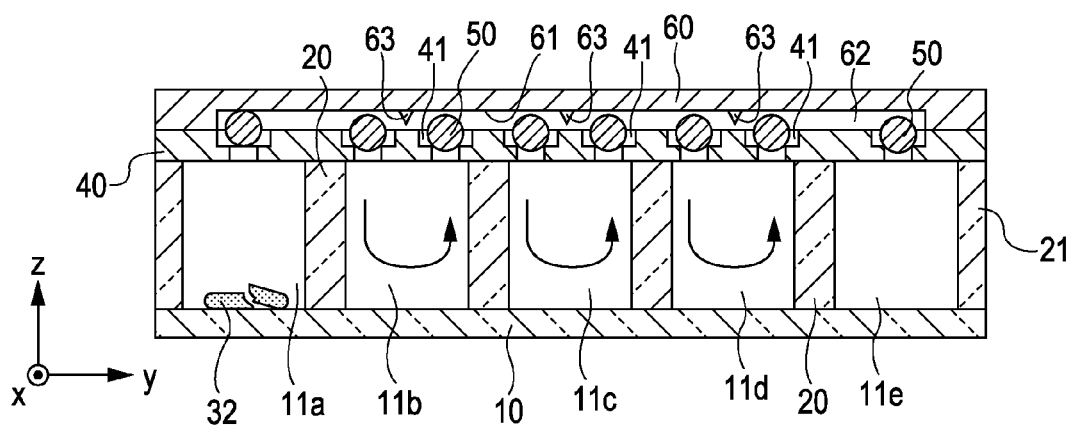
FIG. 18 is a view illustrating a state of the gas cells in the accommodation process according to a variation.

Further, when two or more holes are provided for one space 11, an air flow path which connects the two or more holes to one another at the outside of the spaces 11 may be reduced in diameter or closed. FIG. 18 is a view illustrating a state of the gas cells in the accommodation process according to the variation. As illustrated in FIG. 18, two holes 41 are provided for each of the spaces 11*b*, 11*c*, 11*d*. Further, a protrusion 63 is provided on the air flow path 62 at each of portions on which pairs of holes 41 provided on the spaces 11*b*, 11*c*, 11*d* are connected to one another at the outside of the holes 41.

The air flow path 62 is reduced in diameter with the protrusions 63. Therefore, portions on which the protrusions 63 are provided have pressure loss larger than that of other portions on which the protrusions 63 are not provided and gas is difficult to flow through the portions. Therefore, airflows as indicated by arrows in FIG. 18 are easy to be generated in the spaces 11b, 11c, 11d. That is to say, an air flow path which connects two or more holes 41 provided for the spaces 11 at the outside of the holes 41 is difficult to function as a so-called bypass if the protrusions 63 are provided. Therefore, circulation and extrusion flow of gas in the spaces 11 are prompted. Accordingly, the alkali metal vapor is easy to be accommodated in the accommodation process in the spaces 11 in comparison with a case where the configuration is not provided. It is to be noted that the air flow path 62 may be closed by the protrusions 63. That is to say, the air flow path 62 according to the variation is an example of an air flow path that is reduced in diameter or closed such that gas is difficult to flow through portions on which two or more holes 41 provided for one cell are connected to one another in comparison with other portions.

2-3.

In the above embodiment, the gravity direction is set to the −z direction. However, the gravity direction in the invention is not limited thereto and the invention can be applied to an environment in which gravity is not applied. Even in this case, it is sufficient that each member is configured such that the large-diameter portions 411 of the holes 41 position the solid substances 50, and if the solid substances 50 are molten, the solid substances 50 flow into the small-diameter portions 413 to close the holes 41.

Further, in the above embodiment, the holes 41 have the large-diameter portions 411, the steps 412, and the small-diameter portions 413. However, the holes 41 may not have these portions. That is to say, any configurations of the holes 41 and any shapes of the solid substances 50 may be employed as long as the solid substances 50 before being molten are arranged at positions corresponding to the holes 41 and the corresponding holes 41 are closed if the solid substances 50 are molten.

2-4.

In the above embodiment, a gas containing the alkali metal atoms is accommodated in the spaces 11 of the gas cells 90. However, another gas may be accommodated therein. That is to say, it is sufficient that a gas containing atoms which rotate a polarization plane of linearly polarized light in accordance with a magnetic field if the atoms are excited with light is accommodated in each space 11.

2-5.

In the above embodiment, the manufacturer of the gas cells performs the air flow path removal process of removing the air flow path plate 60 from the ceiling plate 40 by grinding or cutting the air flow path plate 60 with a cutting machine or the like. However, the air flow path removal process may be not necessary if the gas cells 90 can be used in a state where the air flow path 62 is still being bonded to the gas cells 90. In this case, a reinforcing process of bonding the sealing plates 70 to portions from which the air flow path is removed is not also required to be performed.

2-6.

In the above embodiment, the manufacturer of the gas cells performs the separation process of cutting the separation walls at four portions as indicated by dashed-two dotted lines in FIG. 14 with the cutting tool 80 such as a dicer and a cutter. However, the separation process may be not necessary if the gas cells 90 may be used in a state of not being separated from one another.

2-7.

In the above embodiment, the material of each solid substance 50 is gold-based alloy solder such as Au—Sn. However, the material of the solid substance 50 is not limited thereto. That is to say, it is sufficient that each solid substance 50 is a solid substance which is molten so as to close each hole 41.

2-8.

In the above embodiment, the bottom plate 10, the side wall plates 21, and the separation wall plates 20 are bonded to one another, and then, the front plate and the rear plate are bonded thereto. However, the bonding order is not limited thereto. Further, configurations of the gas cells assembled in the assembling process may be such that injection molding by using a transparent resin and a mold is employed instead of bonding the plates.

2-9.

In the above embodiment, the ampule 30 is formed by a material that is broken if any energy such as impact is applied to an outer skin thereof. However, the ampule 30 may be formed by a material other than the above material. For example, the ampule 30 may be formed by a material which breaks after a constant period of time has passed. In this case, if time is adjusted such that the alkali metal vapor is generated from the ampule 30 at a time at which the accommodation process is started, an operation is not required to be performed on the ampule 30 from the outside of the cell. A system for breaking the ampule 30 may not depend on the material thereof. For example, a device which applies impact to the ampule 30 at a predetermined timing may be installed additionally.

Further, the ampule 30 is installed in the space 11a in the assembling process. However, a member to be installed may not be an ampule as long as the member is a generation source which generates alkali metal vapor in the accommodation process. Further, the generation source which generates the alkali metal vapor may be installed not in any of the spaces 11 but on a portion corresponding to the air flow path 62 as a result of the air flow path formation process. That is to say, it is sufficient that the generation source which generates gas containing atoms which rotate a polarization plane of linearly polarized light in accordance with a magnetic field if the atoms are excited with light in the accommodation process is installed in at least one cell or on a portion which becomes the air flow path after the formation process in the assembling process.

2-10.

Figure 19:
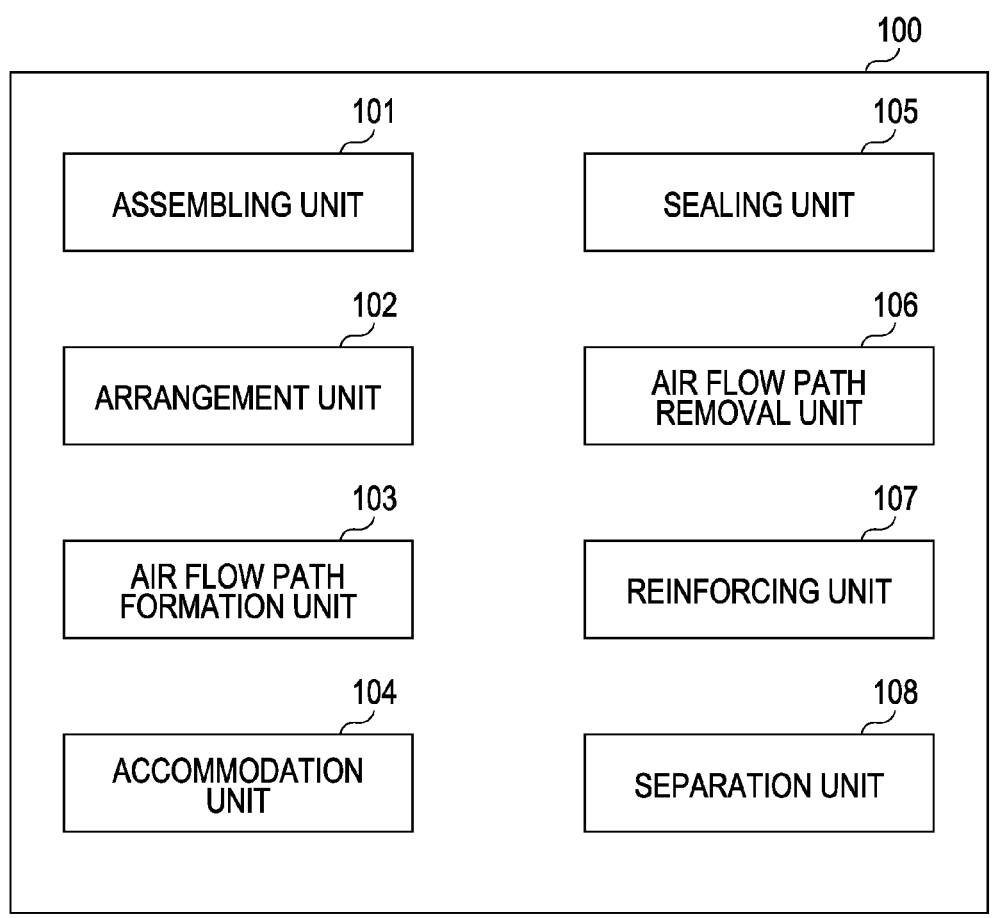
FIG. 19 is a view illustrating an example of a configuration of a manufacturing apparatus for manufacturing a gas cell according to a variation.

The invention can be specified as a manufacturing apparatus for manufacturing the above gas cell 90. FIG. 19 is a view illustrating a configuration of the manufacturing apparatus 100 for manufacturing the above gas cell 90. The manufacturing apparatus 100 includes an assembling unit 101, an arrangement unit 102, an air flow path formation unit 103, an accommodation unit 104, a sealing unit 105, an air flow path removal unit 106, a reinforcing unit 107, and a separation unit 108.

The assembling unit 101 includes a transportation device, a heating device, and a control device. The transportation device transports the above-described transparent members (bottom plate 10, side wall plates 21, separation wall plates 20, front plate, and rear plate) and the ampule 30 to respective predetermined positions. The heating device heats the transported transparent members so as to fusion-bond the transparent members to one another. The control device controls the transported transparent members by a controller including a central processing unit (CPU), a read only memory (ROM), and a random access memory (RAM). Under the control by the control device, the transparent members are arranged, the ampule 30 is arranged, the transparent members are fusion-bonded to one another by the heating device so that a structure as illustrated in FIG. 4 is assembled. It is to be noted that the assembling unit 101 may be a device which performs injection molding as described in the above variation.

The arrangement unit 102 includes a transportation device and a control device. The transportation device arranges the solid substances 50 on the holes 41 of the ceiling plate 40. The control device controls the transportation device. Under the control by the control device, the solid substances 50 are arranged as illustrated in FIG. 6.

The air flow path formation unit 103 includes a positioning device, a heating device, and a control device. The positioning device positions the air flow path plate 60 at a position opposed to the ceiling plate 40. The heating device heats the ceiling plate 40 and the air flow path plate 60 so as to fusion-bond them to one another. The control device controls the positioning device and the heating device. Under the control by the control device, the air flow path 62 is formed as illustrated in FIG. 8.

The accommodation unit 104 includes an irradiation device and a control device. The irradiation device irradiates a short-pulse laser beam 31 onto the ampule 30 from the outside, for example. The control device controls the irradiation device. Under the control by the control device, the ampule 30 is broken and becomes the broken ampule 32 as illustrated in FIG. 9. With this, the alkali metal vapor is accommodated in each space 11.

The sealing unit 105 includes an irradiation device and a control device. The irradiation device irradiates a laser beam 51 onto the solid substances 50 arranged on the holes 41. The control device controls the irradiation device. Under the control by the control device, the solid substances 50 are molten to change to the sealing members 52 so as to close the holes 41 as illustrated in FIG. 11.

The air flow path removal unit 106 includes a cutting device and a control device. The cutting device cuts the transparent members. The control device controls the cutting device. Under the control by the control device, the air flow path plate 60 is cut so as to be removed from the ceiling plate 40 as illustrated in FIG. 12.

The reinforcing unit 107 includes a transportation device, a heating device, and a control device. The transportation device transports the plurality of sealing plates 70 to positions corresponding to the holes 41. The heating device heats the transported sealing plates 70 so as to fusion-bond the transported sealing plates 70 to portions around the holes 41 on the ceiling plate 40. The control device controls the transportation device and the heating device. Under the control by the control device, the sealing plates 70 are fusion-bonded to the ceiling plate 40 so as to close the holes 41 as illustrated in FIG. 13.

The separation unit 108 includes a cutting device and a control device. The cutting device cuts the separation wall plates 20. The control device controls the cutting device. Under the control by the control device, the separation wall plates 20 are cut so that the gas cells 90 are separated from one another as illustrated in FIG. 15.

What is claimed is:

1. Apparatus for forming gas cells comprising:
   at least a first cell and a second cell;
   a broken ampule disposed in the first cell;
   alkali metal vapor filled in at least the second cell;
   a first hole formed on a wall of the first cell and a second hole formed on a wall of the second cell; and
   wherein the first hole and the second hole are closed by a molten solid substance.

2. Apparatus according to claim 1, further comprising:
   an air flow path formed on an outer surface of the first cell and the second cell;
   wherein the air flow path connects the first hole and the second hole.

3. Apparatus according to claim 1, further comprising:
   a sealing plate covering at least the second hole.

4. Apparatus according to claim 1, wherein:
   the first and second cells are separated by a plate sufficiently thick that it can be cut to separate the first and second cells yet provide each cell with a side wall to maintain an enclosure for each cell.

\* \* \* \* \*